United States Patent
Zhang et al.

(10) Patent No.: US 12,087,585 B2
(45) Date of Patent: Sep. 10, 2024

(54) LOW-TEMPERATURE IMPLANT FOR BURIED LAYER FORMATION

(71) Applicant: Applied Materials, Inc., Santa Clara, CA (US)

(72) Inventors: Qintao Zhang, Mt Kisco, NY (US); Samphy Hong, Saratoga Springs, NY (US); Wei Zou, Lexington, MA (US); Judy Campbell Soukup, Saratoga Springs, NY (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/362,946

(22) Filed: Jun. 29, 2021

(65) Prior Publication Data

US 2022/0415657 A1 Dec. 29, 2022

(51) Int. Cl.
  *H01L 21/00* (2006.01)
  *H01L 21/265* (2006.01)
  *H01L 21/266* (2006.01)

(52) U.S. Cl.
  CPC .. *H01L 21/26593* (2013.01); *H01L 21/26533* (2013.01); *H01L 21/266* (2013.01)

(58) Field of Classification Search
  CPC ............... H01L 21/26533; H01L 21/26593
  See application file for complete search history.

(56) References Cited

U.S. PATENT DOCUMENTS

| | | | | |
|---|---|---|---|---|
| 4,151,010 A | * | 4/1979 | Goth | H01L 21/266 438/339 |
| 4,975,385 A | * | 12/1990 | Beinglass | H01L 29/4232 438/304 |
| 5,899,732 A | * | 5/1999 | Gardner | H01L 21/26506 257/E21.336 |
| 6,444,551 B1 | | 9/2002 | Ku et al. | |
| 6,495,294 B1 | * | 12/2002 | Yamauchi | H01L 21/02532 438/597 |
| 9,324,622 B2 | * | 4/2016 | Chuang | H01L 29/66636 |
| 10,243,048 B2 | | 3/2019 | Hu et al. | |
| 11,049,957 B1 | * | 6/2021 | Yoo | H01L 29/7835 |
| 2001/0025999 A1 | * | 10/2001 | Suguro | H01L 29/513 257/E21.337 |
| 2010/0216288 A1 | * | 8/2010 | Chiu | H01L 21/823814 438/231 |
| 2014/0154876 A1 | * | 6/2014 | Tsai | H01L 21/26593 438/510 |

(Continued)

OTHER PUBLICATIONS

"Substrate." Dictionary.com Unabridged, https://www.dictionary.com/browse/substrate. Accessed Oct. 1, 2022. (Year: 2022).*

(Continued)

*Primary Examiner* — Reema Patel
(74) *Attorney, Agent, or Firm* — KDW Firm PLLC

(57) ABSTRACT

Disclosed herein are methods for forming a buried layer using a low-temperature ion implant. In some embodiments a method may include providing an opening through a mask, wherein the mask is formed directly atop a substrate, and forming a buried layer in the substrate by performing a low-temperature ion implant through the opening of the mask. The method may further include forming an oxide layer over the substrate including over the buried layer.

14 Claims, 3 Drawing Sheets

(56) References Cited

U.S. PATENT DOCUMENTS

| | | | |
|---|---|---|---|
| 2015/0380598 A1* | 12/2015 | Loscutoff | H01L 31/02167 |
| | | | 136/255 |
| 2018/0076038 A1* | 3/2018 | Phan | H01L 29/0684 |
| 2018/0315818 A1* | 11/2018 | Hu | H01L 27/088 |
| 2020/0161191 A1* | 5/2020 | Huang | H01L 21/823892 |

OTHER PUBLICATIONS https://www.eetimes.com/an-introduction-to-semiconductor-technologies-for-power-management-part-2/; Downloaded May 15, 2021; 4 pages.

Deignan et al., "Dose Loss and Defect Mechanisms in Antimony Buried Layers for a 0.35um BiCMOS Process"; Date of Conference: Sep. 11-13, 2000; Date Added to IEEE Xplore: Oct. 17, 2005; DOI: 10.1109/ESSDERC.2000.194767; Print ISBN:2-86332-248-6; 4 pages.

Turner, "Producing Stress- and Fault-Free Epitaxial Silicon Over Buried Antimony Layers"; Published in: Twenty Fourth IEEE/CPMT International Electronics Manufacturing Technology Symposium (Cat. No.99CH36330); Print ISBN:0-7803-5502-4; DOI: 10.1109/IEMT.1999.804813; 7 pages.

* cited by examiner

LOW-TEMPERATURE IMPLANT FOR BURIED LAYER FORMATION

FIELD OF THE DISCLOSURE

The present embodiments relate to semiconductor device patterning and, more particularly, to a low-temperature implant to buried layers in semiconductor devices.

BACKGROUND OF THE DISCLOSURE

Semiconductor devices with analog components may have an n-type buried layer (NBL) doped with antimony (Sb) or phosphorous (P), or a p-type buried layer (PBL) doped with boron (B), boron co-implanted with carbon (B+C), gallium (Ga) co-implanted with germanium (Ga+Ge), indium (In), or difluoroboron ($BF_2$). Antimony is a commonly used dopant for the NBL due to its low diffusion coefficient. Doping with antimony enables high dopant density (and hence low sheet resistance for the NBL) without diffusing into other components. B, B+C, Ga+Ge, and In are commonly used dopants for the PBL in which, depending on following thermal budget, one or a combination of dopants can be select enable required sheet resistance and out-diffusion. The NBL is commonly formed by starting with a p-type silicon substrate, and growing a thick layer of thermal/pad oxide on the top surface of the substrate. PBL on the other hand may start with a n-type substrate. A photoresist mask is patterned over the thick oxide, exposing the area for the NBL or PBL. Antimony or other p-type species is implanted into the silicon, through the thick oxide, to provide a desired low sheet resistance. The thick oxide blocks the dopants from the substrate outside of the NBL or PBL area. However, due to the presence of the thick oxide, dislocation loops, which may result from residual lattice strains from the NBL or PBL implant, can't be removed.

It is with respect to these and other deficiencies of the prior art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing an opening through a mask, wherein the mask is formed directly atop a substrate, forming a buried layer in the substrate by performing a low-temperature ion implant through the opening of the mask, and forming an oxide layer over the substrate including over the buried layer.

In another aspect, a method may include providing a mask directly atop a substrate, wherein the mask includes an opening recessed to a top surface of the substrate, and forming a buried layer in the substrate by performing a low-temperature ion implant through the opening of the mask. The method may further include forming an oxide layer over the substrate including directly atop the buried layer.

In yet another aspect, a method may include patterning an opening through a mask, wherein the mask is provided directly atop a substrate, and forming the buried layer in the substrate by performing a low-temperature ion implant through the opening of the mask, wherein the low-temperature ion implant is performed at a temperature less than 0° Celsius. The method may further include forming an oxide layer over the substrate including directly atop the buried layer.

BRIEF DESCRIPTION OF THE DRAWINGS

The accompanying drawings illustrate exemplary approaches of the disclosure, including the practical application of the principles thereof, as follows.

Figure 1:
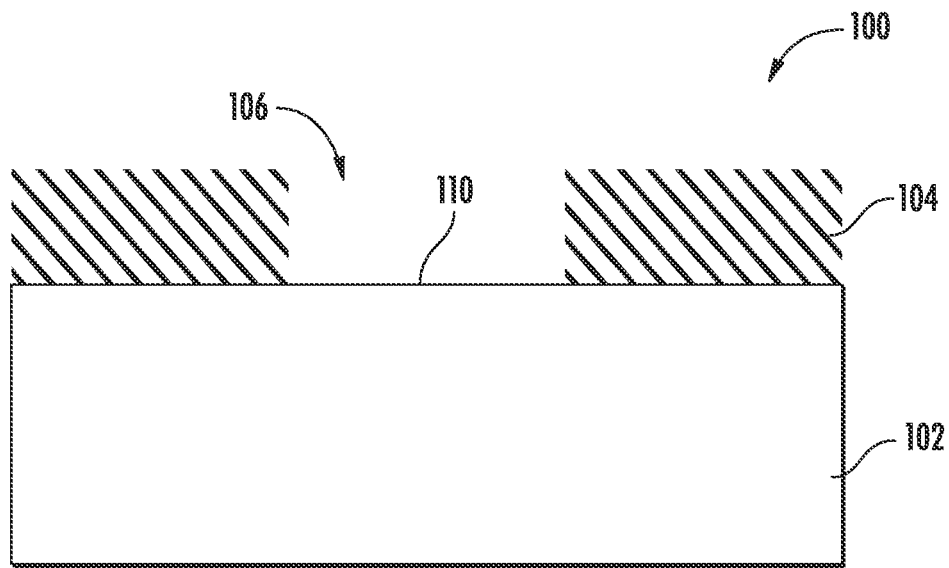
FIG. 1 is a cross-sectional side view of a substrate and mask according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, devices, and systems in accordance with the present disclosure will now be described more fully hereinafter with reference to the accompanying drawings, where various embodiments are shown. The methods, devices, and systems may be embodied in many different forms and are not to be construed as being limited to the embodiments set forth herein. Instead, these embodiments are provided so the disclosure will be thorough and complete, and will fully convey the scope of the methods to those skilled in the art.

Embodiments of the present disclosure provide a novel low-temperature implantation process into a buried substrate layer to enable formation of a high-quality epitaxy layer thereupon. Unlike some prior art approaches that employ a pad oxide to block low dose regions of the substrate, the implant of the present disclosure may directly impact the substrate, thus applying to a wider variety of devices including, but not limited to, bipolar CMOS-DMOS (BCD), bipolar-CMOS (BiCMOS), or bipolar junction transistors (BJT).

FIG. 1 is a side cross-sectional view of a semiconductor device structure (hereinafter "device") 100 at one stage of processing. Although non-limiting, the device 100 may eventually become a bipolar complementary metal-oxide-semiconductor (BiCMOS), a CMOS, a DMOS, etc. As shown, the device 100 may include a substrate or wafer 102 made from a semiconductor material. Although non limiting, the substrate 102 may be a bulk silicon wafer, a silicon-on-insulator (SOI) wafer, a silicon wafer with an epitaxial layer, or other substrate suitable for forming a semiconductor device. The semiconductor material may include silicon that is doped p-type or n-type, for example by boron or phosphorous. The semiconductor material may include silicon of a bulk silicon wafer, may include silicon of an epitaxial layer, or may include silicon of a transfer layer.

As shown, the mask 104 may be formed atop the substrate 102. The mask 104 may including an opening 106 formed therein. The opening 106 may expose a top surface 110 of the substrate. Although non-limiting, the mask 104 may include a photoresist formed by a photolithographic operation. The mask 104 may further include anti-reflection material such as a bottom anti-reflection coating (BARC). The mask 104 may be sufficiently thick to absorb atoms impacting the implant mask 104 during a subsequent implant process, so as to prevent degradation of performance parameters of the semiconductor device.

Figure 2:
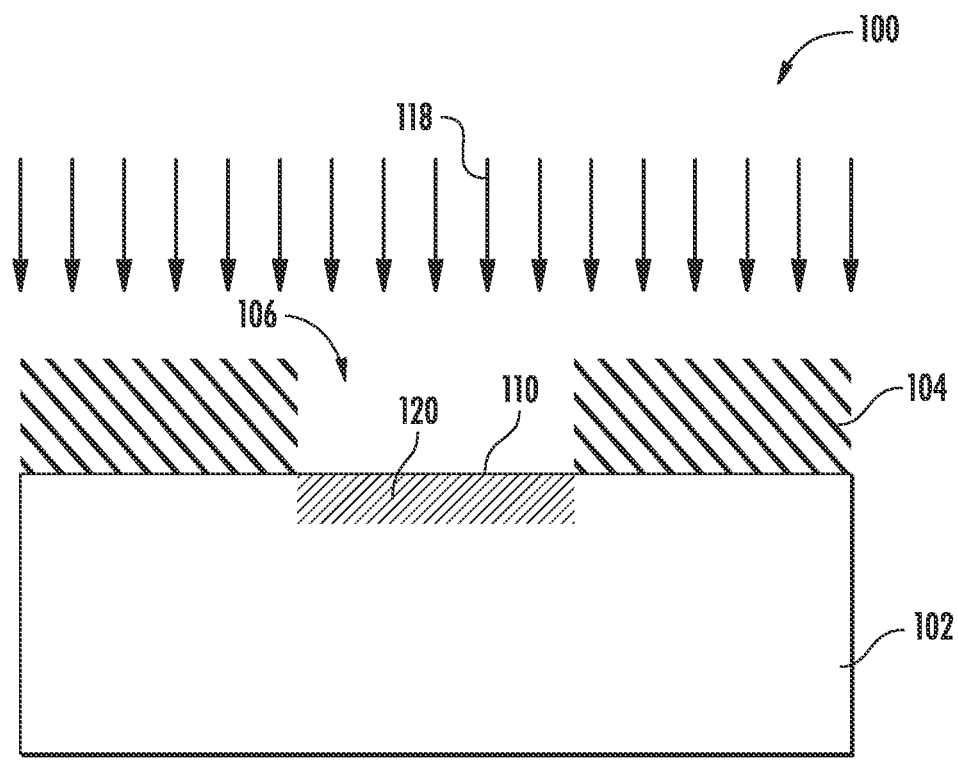
FIG. 2 is a side cross-sectional view illustrating formation of a buried layer in the substrate using a low-temperature ion implant, according to embodiments of the present disclosure.

As shown in FIG. 2, a low-temperature ion implant process may be performed to deliver ions, such as antimony (Sb) ions or phosphorous (P) ions, into the substrate 102 to form a buried layer 120. An ion beam 118, including desired ions, may be directed at the substrate 102. The substrate 102 may be maintained at a temperature of 0 degrees Celsius or lower. In the embodiment shown, the buried layer 120 may be an n-type buried layer (NBL). In other embodiments, the buried layer 120 may be a p-type buried layer (PBL), which may be doped with ions such as B, Ga in Ge, indium (In), B with C, or $BF_2$. As shown, the ion beam 118 may be delivered directly into the top surface 110 of the substrate 102 exposed within the opening 106 of the mask 104. In various embodiments, the ion beam 118 may be delivered as part of a cryogenic ion implant, which is performed between 0 and −100 degrees Celsius (C). In some embodiments, the cryogenic ion implant includes chilling a platen (not shown) upon which the substrate 102 is provided.

In some embodiments, the ion beam 118 may be delivered at a pre-defined angle, a predefined energy, a predefined dose, etc. In some embodiments, both a high current (e.g., 80 KeV or lower) and a medium current (e.g., 100 Kev or higher) can be used to generate high enough vacancies thus fully amorphized substrate 102. Although non-limiting, the implant angle may be perpendicular, or approximately perpendicular, to a plane defined by the top surface 110 of the substrate 102. The implantation angle may vary in other embodiments.

Figure 3:
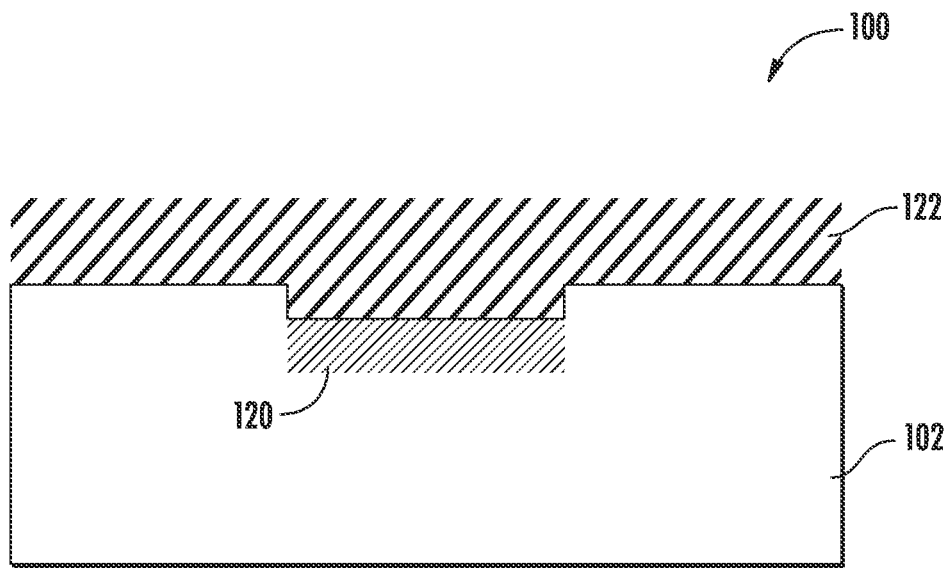
FIG. 3 is a side cross-sectional view illustrating formation of an oxide layer according to embodiments of the present disclosure.

Next, as shown in FIG. 3, the mask 104 may be removed and an oxide layer (e.g., thermal oxide) 122 may be formed atop the substrate 102, including directly atop the buried layer 120. The oxide layer 122 may function as a capping layer to block dopant out-diffusion. Although non-limiting, the oxide layer 122 may be part of an anneal/diffusion process which anneals the semiconductor material in the buried layer 120 and diffuses the implanted antimony deeper into the substrate 102. During the ramp thermal oxidation process, the temperature of the substrate 102 may be increased, for example, from below 500° C. to above 1000° C. The oxide layer 122 may reduce loss of the implanted dopants, such as antimony, B, or Indium (but not limited to these species) through the top surface 110 of the semiconductor material. Furthermore, the silicon in the buried layer 120 may be partially amorphous or fully amorphous due to the high-dose implant before thermal oxidation process.

Figure 4:
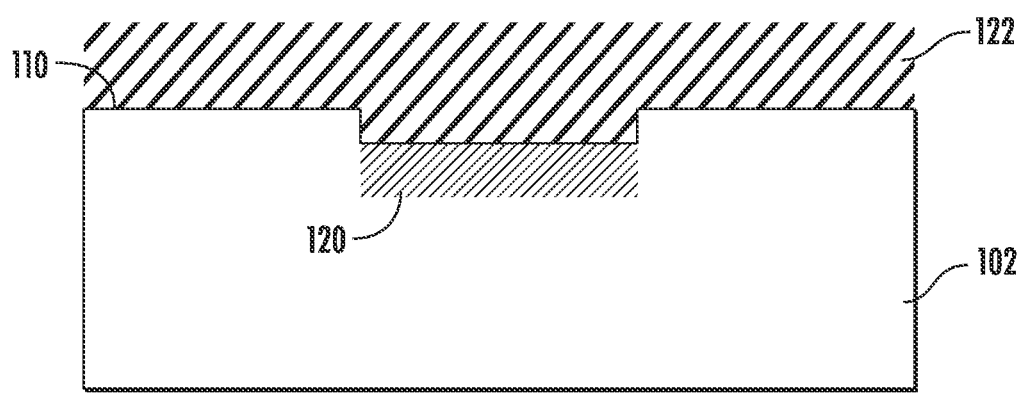
FIG. 4 is a side cross-sectional view illustrating an annealing process according to embodiments of the present disclosure.

As shown in FIG. 4, the device 100 may then be subjected to an annealing process 128, which drives-in/activates dopants and moves defects (e.g., EOR defects) up to the top surface 110 for removal during a subsequent oxide removal process. The annealing process 128 may be a relatively lower furnace anneal (e.g., below 450° C.) or a higher temperature laser spike anneal (LSA). After oxidation and annealing steps, the buried layer is expected to be defect-free. Although not shown, the oxide layer 122 may then be removed, for example, by a wet etch process, which includes an aqueous solution of dilute buffered hydrofluoric acid. Other methods of removing the oxide layer 122 are within the scope of the present disclosure. After the oxide layer 122 is removed, an epitaxy step with in-situ doping (n-type or p-type) will be processed. Because of the defect-free buried layer, epitaxy quality is improved as compared to those processes using an implant.

Figure 5:
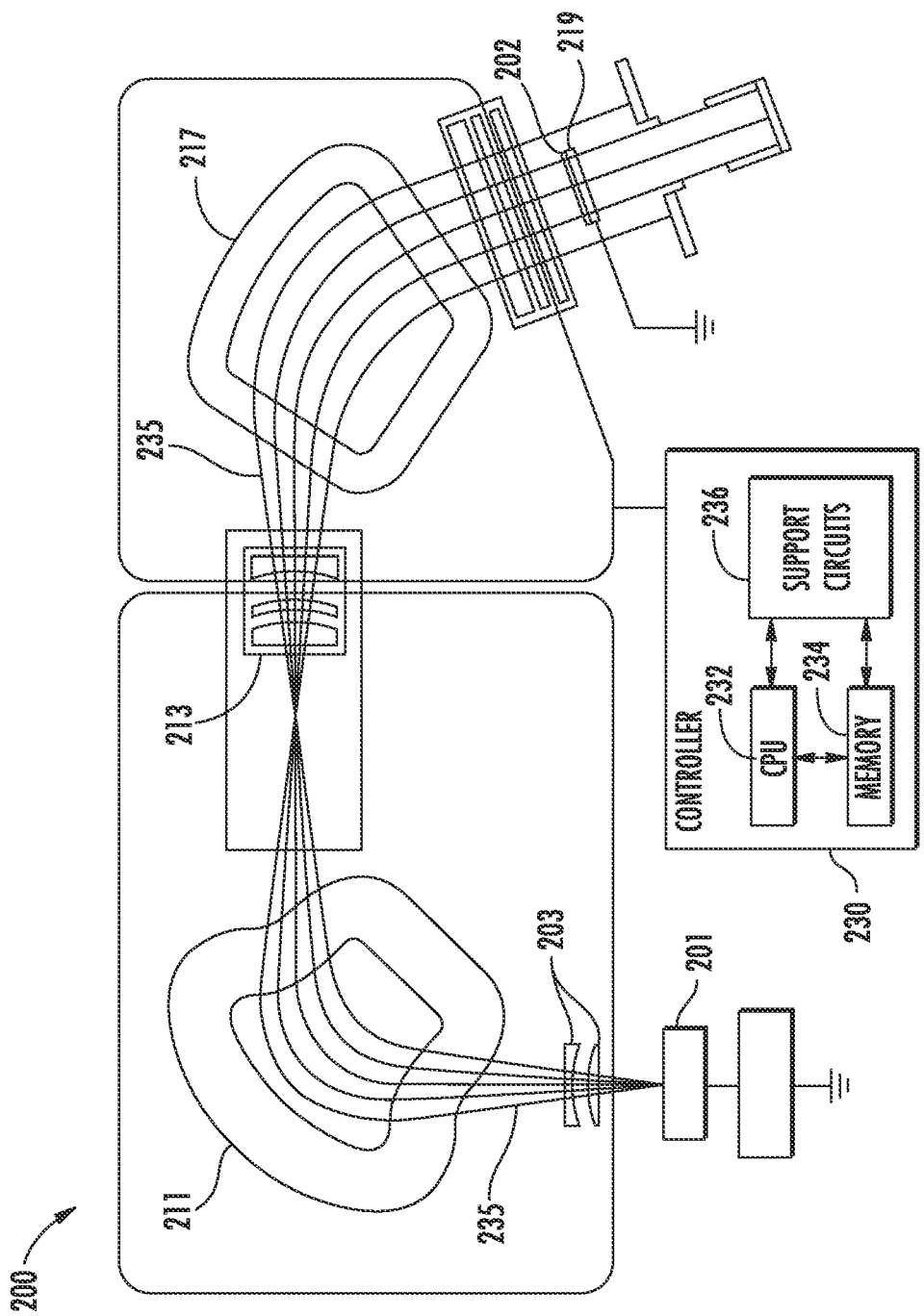
FIG. 5 illustrates a schematic diagram of a processing apparatus according to embodiments of the present disclosure.

FIG. 5 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion implant, such as the low-temperature ion implant 118 demonstrated in FIG. 2. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 (wafer) to be processed. The substrate 202 may be the same as the substrate/wafer 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232. The memory 234 is in the form of computer-readable storage media that contains instructions, that when executed by the CPU 232, facilitates the operation of the apparatus 200.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    providing an opening through a mask, wherein the mask is a photoresist formed directly atop an exposed top surface of a substrate;
    forming a buried layer in the substrate by directing ions through the opening of the mask while maintaining the substrate at a temperature of less than or equal to 0 degrees Celsius, wherein the ions are directed into the exposed top surface of the substrate, and wherein no oxide layer is present beneath the mask while the ions are directed into the exposed top surface of the substrate;
    removing the mask;
    forming an oxide layer over the substrate including over the buried layer; and
    annealing the substrate and the oxide layer after the mask is removed and while an upper surface of the oxide layer remains entirely exposed, wherein the oxide layer extends into the buried layer, beneath the top surface of the substrate.

2. The method of claim 1, further comprising removing the mask prior to forming the oxide layer.

3. The method of claim 1, wherein the ions comprise antimony ions, phosphorous ions, Boron ions, Boron ions co-implanted with Carbon ions, Gallium ions co-implanted with Ge ions, or Indium ions.

4. The method of claim 1, wherein the buried layer is formed while maintaining the substrate at a temperature less than −30° Celsius.

5. The method of claim 1, further comprising forming the oxide layer directly atop the buried layer.

6. The method of claim 1, further comprising removing the oxide layer after the substrate and the oxide layer are annealed.

7. A method, comprising:
    providing a mask directly atop an exposed top surface of a substrate, wherein the mask includes an opening recessed to a top surface of the substrate, and wherein the mask is a photoresist;
    forming a buried layer in the substrate by directing ions through the opening of the mask while maintaining the substrate at a temperature of less than or equal to 0 degrees Celsius, wherein the ions are directed into the exposed top surface of the substrate, and wherein no oxide layer is present beneath the mask while the ions are directed into the exposed top surface of the substrate;
    removing the mask;
    forming an oxide layer over the substrate including directly atop the buried layer; and
    annealing the substrate and the oxide layer after the mask is removed and while an upper surface of the oxide layer remains entirely exposed, wherein the oxide layer extends into the buried layer, beneath the top surface of the substrate.

8. The method of claim 7, further comprising removing the mask prior to forming the oxide layer.

9. The method of claim 7, wherein the ions comprise antimony ions, phosphorous ions, Boron ions, Boron ions co-implanted with Carbon ions, Gallium ions co-implanted with Ge ions, or Indium ions.

10. The method of claim 7, wherein the buried layer is formed while maintaining the substrate at a temperature less than −30° Celsius.

11. A method of forming a buried layer, comprising:
    patterning an opening through a mask, wherein the mask is a photoresist provided directly atop a top surface of a substrate;
    forming a buried layer in the substrate by directing ions through the opening of the mask while maintaining the substrate at a temperature of less than or equal to 0 degrees Celsius, wherein the ions are directed into the top surface of the substrate to form the buried layer without the presence of an oxide layer beneath the mask;
    removing the mask;
    forming an oxide layer over the substrate including directly atop the buried layer; and
    annealing the substrate and the oxide layer after the mask is removed and while an upper surface of the oxide layer remains entirely exposed, wherein the oxide layer extends into the buried layer, beneath the top surface of the substrate.

12. The method of claim 11, further comprising removing the mask prior to forming the oxide layer.

13. The method of claim 11, wherein the ions comprise antimony ions, phosphorous ions, Boron ions, Boron ions co-implanted with Carbon ions, Gallium ions co-implanted with Ge ions, or Indium ions.

14. The method of claim 11, wherein the buried layer is formed while maintaining the substrate at a temperature less than −30° Celsius.

* * * * *